United States Patent [19]

Hirokane

[11] Patent Number: 6,008,142
[45] Date of Patent: Dec. 28, 1999

[54] FABRICATION PROCESS OF SEMICONDUCTOR DEVICE

[75] Inventor: Munehiko Hirokane, Tokyo, Japan

[73] Assignee: NEC Corporation, Japan

[21] Appl. No.: 08/543,165

[22] Filed: Oct. 13, 1995

[30] Foreign Application Priority Data

Oct. 14, 1994 [JP] Japan .................................. 6-276058

[51] Int. Cl.⁶ .................................................. H01L 21/316
[52] U.S. Cl. ........................ 438/770; 438/309; 438/488
[58] Field of Search ................................... 437/101, 233, 437/31, 235, 246, 193, 186, 225, 946, 949, 967, 247, 248; 438/488, 762, 778, 765, 909, 974, 770, 787, 769; 427/248.1, 255.1, 255.4

[56] References Cited

U.S. PATENT DOCUMENTS

| 5,023,206 | 6/1991 | Freeman | 438/906 |
| 5,194,397 | 3/1993 | Cook et al. | 438/684 |
| 5,334,556 | 8/1994 | Guldi | 438/308 |
| 5,352,636 | 10/1994 | Beinglass | 438/473 |
| 5,648,282 | 7/1997 | Yoneda | 438/305 |
| 5,798,141 | 8/1998 | Harada | 438/770 |

FOREIGN PATENT DOCUMENTS 59-35433 2/1984 Japan .
2-20328 2/1990 Japan .

Primary Examiner—Savitri Mulpuri

[57] ABSTRACT

In a furnace tube of a heat treatment apparatus, a mixture gas containing 5 to 25 vol %, preferably 20 vol % of $O_2$ and 95 to 75 vol %, preferably 80 vol % of $N_2$ is supplied to maintain the interior space of the heat treatment furnace tube in atmosphere of the mixture gas. Then, a semiconductor wafer is inserted in the furnace tube. Subsequently, the interior space of the furnace tube is purged by an $N_2$ gas, and thereafter, vacuum is introduced. At this condition, a polycrystalline silicon layer is formed by way of low pressure chemical vapor deposition method. Thereafter, the interior space is purged by the $N_2$ gas and the semiconductor wafer is removed from the furnace tube. By this, penetration of the ambient air into the furnace tube upon inserting the semiconductor wafer therein can be prevented to permit formation of uniform thickness of natural oxide layer. Accordingly, when the present invention is applied in fabrication of a bipolar transistor, the thickness of the natural oxide layer formed in the emitter contact portion becomes uniform to reduce fluctuation of $h_{FE}$ in the each wafer, between the wafers and between batch processes to improve controllability of $h_{FE}$.

18 Claims, 4 Drawing Sheets

FABRICATION PROCESS OF SEMICONDUCTOR DEVICE

BACKGROUND OF THE INVENTION

1. Field of the Invention

The present invention relates generally to a fabrication process of a semiconductor device. More specifically, the invention relates to a heat treatment method utilizing a furnace.

2. Description of the Related Art

FIG. 1 shows a section of an NPN type bipolar transistor. As shown in FIG. 1, in the NPN type bipolar transistor, a P-type base region 52 is selectively formed in an N-type epitaxial layer 51 which serves as a collector region, and an insulation layer 53 of a silicon dioxide is formed on the P-type base layer 52.

In the silicon dioxide layer 53, an emitter window 54 is selectively formed at a portion above the P-type base region 52. A polycrystalline silicon electrode 55 is selectively formed to be buried within the emitter hole 54. Subsequently, an N-type impurity, such as arsenic or so forth, is doped in the polycrystalline silicon electrode 55. Then, heat treatment is performed for selectively forming an N-type emitter region 57 on the surface of the P-type base region 52.

The formation process of the polycrystalline silicon electrode 55 is performed by way of a low pressure chemical vapor deposition method. In the process of formation, a silicon dioxide layer 56 normally in a thickness of 15 to 30 Å, which is referred to as natural oxide layer, is formed between the polycrystalline silicon electrode 55 and the P-type base region 52.

Depending upon the thickness of the natural oxide layer 56, a common-emitter current gain $h_{FE}$ (hereinafter occasionally expressed only by "$h_{FE}$") is determined. Therefore, in the fabrication process of the bipolar transistor, it becomes necessary to have high controllability of the low pressure chemical vapor deposition and thus controllability of $h_{FE}$.

FIG. 2 is a section of a heat treatment apparatus employed in a conventional fabrication process for a semiconductor device, and shows a construction of a heat treatment furnace employed in a process for forming the polycrystalline silicon electrode 55 in the conventional semiconductor device (see Japanese Unexamined Patent Publication (Kokai) No. Showa 59-35433). As shown in FIG. 2, in the conventional heat treatment furnace, a furnace tube 2 is inserted within the furnace body 1 in horizontal orientation. The furnace tube 2 is formed into a cylindrical configuration and has an end wall 8 at one end and an opening 9 for inserting and removing a boat 4 into and out of the furnace tube 2 at the other end. The opening 9 is closed by a lid 10. On the end wall 8 of the furnace tube 2, a vacuum pump 5 is provided for ventilating the furnace tube 2 to establish a vacuum condition therein. Also, in the end wall 8 of the furnace tube 2, a gas introduction port 6 for introducing an inert gas, such as $N_2$ gas, is provided. In the lid 10, a material gas introduction port 7 for introducing a material gas is provided. The furnace tube 2 is designed to accommodate the boat 4, on which a plurality of semiconductor wafers 3 are arranged vertically with a given interval.

In the conventional heat treatment apparatus, when the semiconductor wafers 3 are inserted into the furnace tube 2, an $N_2$ gas is flowed within the furnace tube 2 via an introduction port 6 for preventing ambient air from penetrating into the interior space of the furnace tube 2 and thus for preventing fluctuation of the quality of the product due to disturbance of atmosphere in the furnace tube 2.

It should be noted that the penetration of the ambient air means that the ambient air is introduced into the interior space of the furnace tube 2 together with the semiconductor wafer 3 upon insertion of the semiconductor wafers 3 into the furnace tube 2.

Next, conventional process steps will be discussed.

In general, in the low pressure chemical vapor deposition method of a polycrystalline silicon, the semiconductor wafers 3 and the boat 4 are inserted into the furnace tube 2 under a flow of $N_2$ gas within the interior space of the furnace tube 2. Subsequently, the gas in the furnace tube 2 is discharged by means of the vacuum pump 5 to establish a vacuum condition (approximately 0.75 Torr). Thereafter, by introducing a silane gas as the material gas through the introduction port 7, a polycrystalline silicon layer is grown on the surface of the semiconductor wafer 3. Subsequently, $N_2$ gas is introduced into the interior space of the furnace tube 2 through the introduction port 6 for purging. Thereafter, with maintaining supply of the $N_2$ gas into the furnace tube 2, the lid 10 is opened to remove the semiconductor wafers 3 from the furnace tube 2.

To avoid the influence of a small amount of oxygen brought into the furnace tube with the semiconductor wafers 3, according to a further known method the semiconductor wafers 3 are inserted into the furnace tube 2 while maintaining a temperature in the furnace at low temperature. A vacuum condition is then established within the furnace, the interior space of the furnace is purged by introduction of the $N_2$ gas, and thereafter the temperature within the furnace is elevated to perform heat treatment. Such method has been disclosed in Japanese Unexamined Patent Publication No. Showa 59-35433. On the other hand, Japanese Unexamined Patent Publication No. Heisei 2-20328 discloses a method for performing heat treatment by providing a preliminary vacuum chamber at the opening portion of the furnace tube, and initially placing the wafer boat holding the semiconductor wafers within the preliminary vacuum chamber, subsequently introducing inert gas into the preliminary vacuum chamber for replacing the atmosphere in the preliminary vacuum chamber with the inert gas, and then transferring the boat holding the semiconductor wafers from the preliminary vacuum chamber to the furnace tube to perform heat treatment.

However, in the conventional heat treatment apparatus for the semiconductor device, a problem is encountered in that a larger diameter furnace tube 2 inherently has a higher possibility of introduction of the ambient air into the furnace tube 2 upon insertion of the boat 4 supporting the semiconductor wafers 3.

In addition, because of non-uniformity of heat distribution within the furnace, a condition for heat treatment for the semiconductor wafers 3 can be fluctuate depending upon the position of respective semiconductor wafers 3 within the boat 4.

For instance, when a polycrystalline silicon layer for the emitter electrode is to be grown by the low pressure chemical vapor deposition method, due to penetration of ambient air into the furnace tube and non-uniformity of the temperature distribution to the furnace, the natural oxide layer formed at the emitter contact portion may have relatively large local fluctuation in thickness in a respective wafer, fluctuation in thickness between a plurality of wafers and fluctuation in thickness between batch processes. The polycrystalline silicon layer comprising the emitter electrode is formed on the natural oxide layer having large fluctuation as set forth above. As a result, fluctuation in $h_{FE}$ of the bipolar transistor is caused and a yield of production is lowered.

Moreover even in the method for preventing penetration of ambient air by inserting the semiconductor wafers after maintaining a low temperature in the furnace, since heat treatment is performed after inserting the semiconductor wafers at low temperature, it requires a long process period or makes the apparatus large.

Furthermore, even by the method of providing the preliminary vacuum chamber and placing the semiconductor wafers within the inert gas atmosphere within the preliminary vacuum chamber and then transferring the semiconductor wafers into the furnace tube, the process period is similarly expanded and the apparatus is made larger.

SUMMARY OF THE INVENTION

The present invention provides a fabrication process for a semiconductor device which permits formation of a uniform natural oxide layer in an emitter contact portion, improvement of controllability in a low pressure chemical vapor deposition process, and elimination of fluctuation of hFE in respective wafers, fluctuation between wafers and fluctuation between batch processes, without requiring an increase in the size of an apparatus or expansion of the process period.

According to the present invention, a fabrication process of a semiconductor device comprises the steps of: maintaining an inner space of a heat treatment chamber under a mixture gas containing 75 to 95 vol % of $N_2$ and 5 to 25 vol % of $O_2$; inserting a semiconductor wafer into a heat treatment chamber under the mixture gas; and performing heat treatment for the semiconductor wafer within the heat treatment chamber.

The heat treatment process may be a low pressure chemical vapor deposition step of a polycrystalline silicon layer forming an emitter electrode of a bipolar transistor.

In the present invention, the inner space of the heat treatment chamber is maintained under an atmosphere of mixture gas containing 75 to 95 vol % of $N_2$ and 5 to 25 vol % of $O_2$ for avoiding penetration of the ambient air together with the semiconductor wafer and for maintaining oxygen concentration constant before and after the insertion of the semiconductor substrate for avoiding influence of penetration of the ambient air. In the experiments performed by the inventors, it has been found that similar effect can be obtained in a range of 5 to 25% of oxygen flow rate. Therefore, the preferred range of the oxygen flow rate is 5 to 25%, preferably in a range of 18 to 22%, and remaining portion is an inert gas, such as $N_2$.

As set forth above, in accordance with the present invention, in advance of setting of the semiconductor wafer, a mixture gas containing 5 to 25 vol %, preferably 20 vol %, of $O_2$ and 95 to 75 vol %, preferably 80 vol %, of $N_2$ is supplied in the heat treatment chamber to maintain the interior space of the heat treatment chamber in an atmosphere of the mixture gas. By this, penetration of ambient air into the furnace tube upon inserting the semiconductor wafer therein can be prevented to permit formation of a uniform thickness natural oxide layer. Accordingly, when the present invention is applied in the fabrication of a bipolar transistor, the thickness of the natural oxide layer formed in the emitter contact portion becomes uniform to reduce fluctuation of $h_{FE}$ in the wafer, between the wafers and between batch processes to improve controllability of $h_{FE}$.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
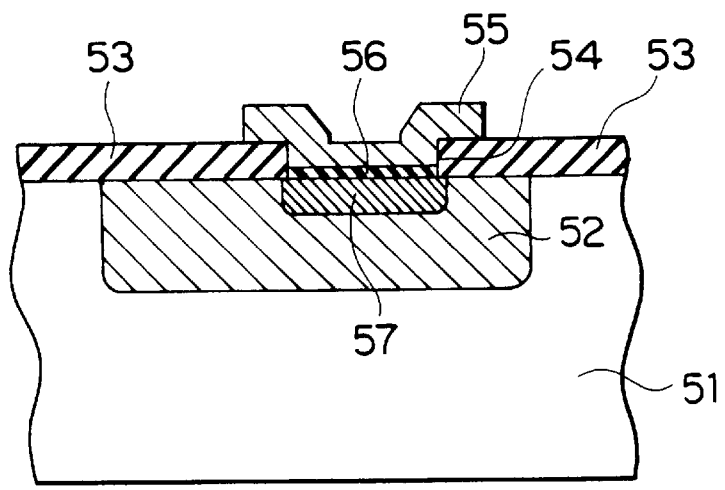
FIG. 1 is a section of an emitter of an NPN type bipolar transistor.
Figure 2:
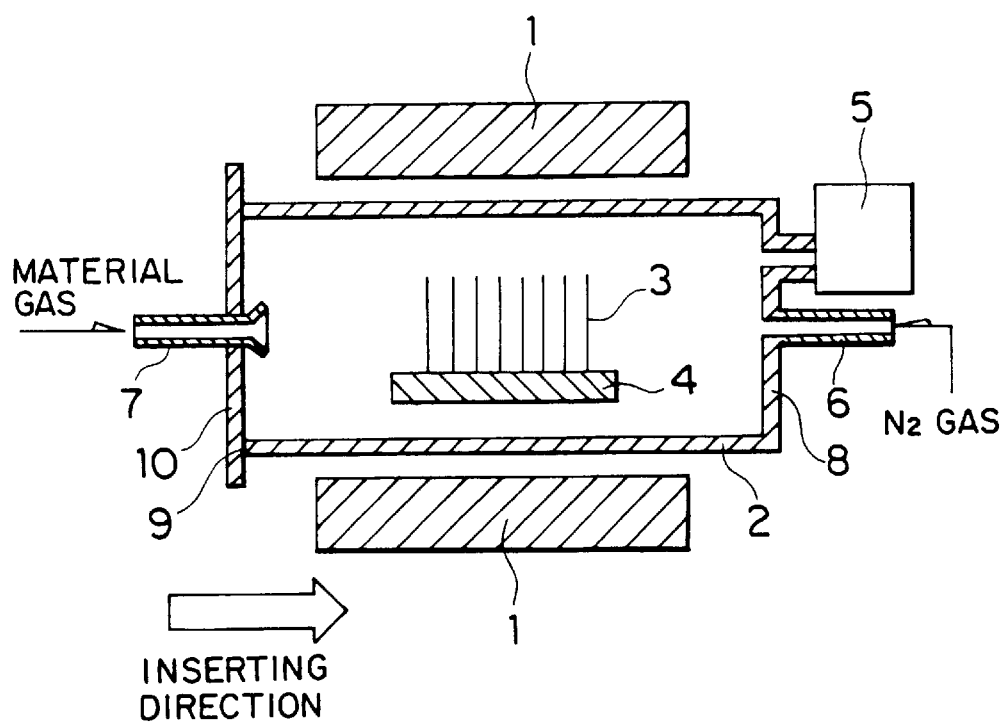
FIG. 2 is a section of the conventional heat treatment apparatus employed in semiconductor device fabrication.
Figure 3:
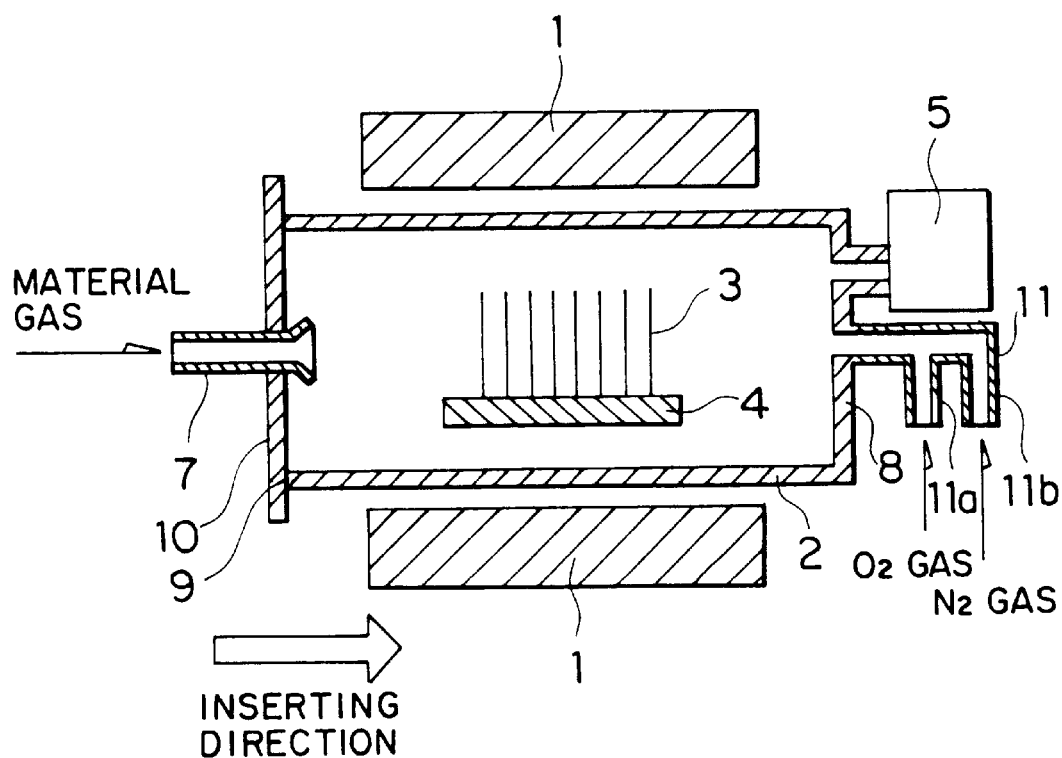
FIG. 3 is a section of one embodiment of a heat treatment apparatus according to the present invention.

FIG. 3 is a section showing one embodiment of a heat treatment apparatus according to the invention. In FIG. 3, the like elements to the conventional heat treatment apparatus illustrated in FIG. 2 will be represented by like reference numerals, and detailed description therefor will be omitted to facilitate understanding of the invention.

In the illustrated embodiment, the heat treatment apparatus is constructed with the furnace body 1, the furnace tube 2 installed in the furnace body 1, the boat 4 for supporting the semiconductor wafers 3, the vacuum pump 5 for establishing a vacuum condition within the furnace tube 2, and the material gas introduction port 7 introducing the material gas into the furnace tube 2, which have similar construction to the conventional apparatus.

In the shown embodiment, in place of the conventional introduction port 6, a gas introduction port 11 having a gas introduction port 11a connected to an $O_2$ gas supply cylinder (not shown) and a gas introduction port 11b connected to an $N_2$ gas supply cylinder (not shown) is provided in the end wall 8. $O_2$ gas and $N_2$ gas supplied via respective introduction ports 11a and 11b are mixed in the introduction port 11 and supplied into the furnace tube 2 as a mixture gas.

Figure 4:
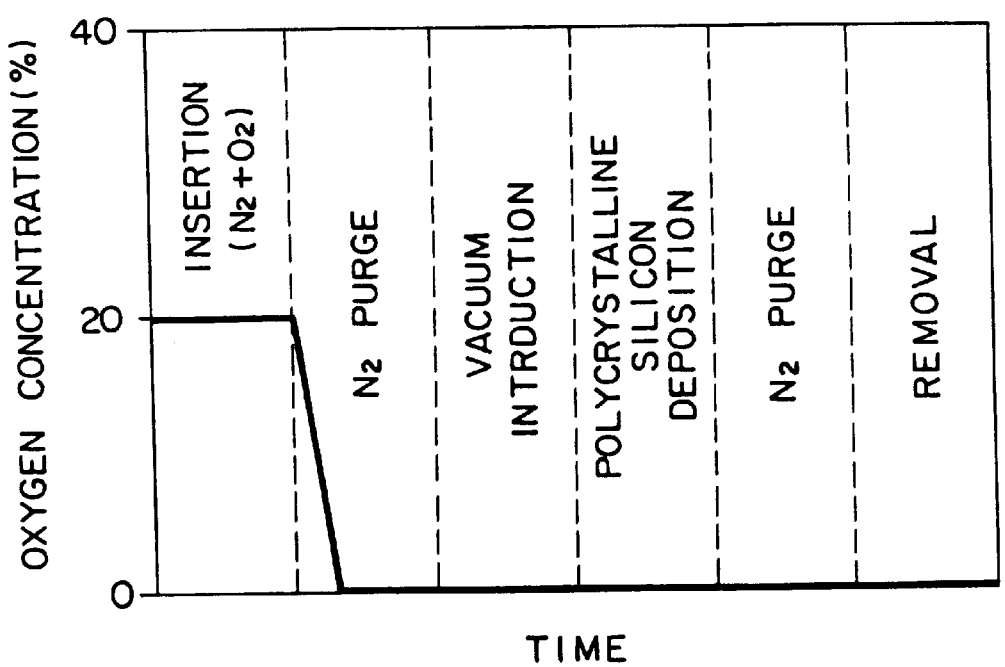
FIG. 4 is a graph showing variation of an oxygen concentration within a furnace tube according to the present invention.

Next, operation of the shown embodiment will be discussed with reference to FIGS. 3 and 4. FIG. 4 is a graph showing variation of oxygen concentration in the furnace tube 2 of the shown embodiment of the heat treatment apparatus shown in FIG. 3, with respect to an elapsed processed time in the furnace tube 2.

At first, in the step for inserting the boat 4 holding the semiconductor wafers 3 in the fabrication process of the semiconductor device, the mixture gas having substantially the same composition as the ambient air, e.g. approximately 80% of $N_2$ and approximately 20% of $O_2$, is supplied into the furnace tube 2. By generating a flow of the mixture gas of $N_2$ and $O_2$, penetration of the ambient air upon opening of the lid 10 can be successfully prevented, and oxygen concentration in the furnace tube 2 can be maintained constant. At this condition, the semiconductor wafers 3 and the boat 4 are inserted into the furnace tube 2.

Next, only $N_2$ gas is introduced into the furnace tube 2 through the gas introduction port 11b to cause a flow of $N_2$ gas to replace the atmosphere of the wafers 3 with the $N_2$ gas. During the replacing process of the $N_2$ gas, the lid 10 is mounted on the opening 9 of the furnace tube 2.

After completion of replacement with the $N_2$ gas, the $N_2$ gas is discharged to establish a vacuum pressure condition within the furnace tube 2 by means of the vacuum pump 5.

Subsequently, the silane gas is introduced into the furnace tube 2 through the material gas introduction port 7 to deposit approximately 2000 Å of polycrystalline silicon layer on the semiconductor wafer 3. Thereafter, the supply of the material gas into the furnace tube 2 is terminated, and the $N_2$ gas is again introduced into the furnace tube 2 via the gas introduction port 11a to replace the gas in the furnace tube with the $N_2$ gas. Thereafter, the semiconductor wafers 3 and the boat 4 are removed from the furnace tube 2.

In the shown embodiment, as shown in FIG. 4, when the semiconductor wafers 3 are set in the furnace tube 2, the atmosphere in the furnace tube 2 is occupied by the mixture gas of $N_2$ and $O_2$. The concentration of the $O_2$ gas is held constant until the semiconductor wafers 3 are inserted into the furnace tube 2.

Figure 5A:
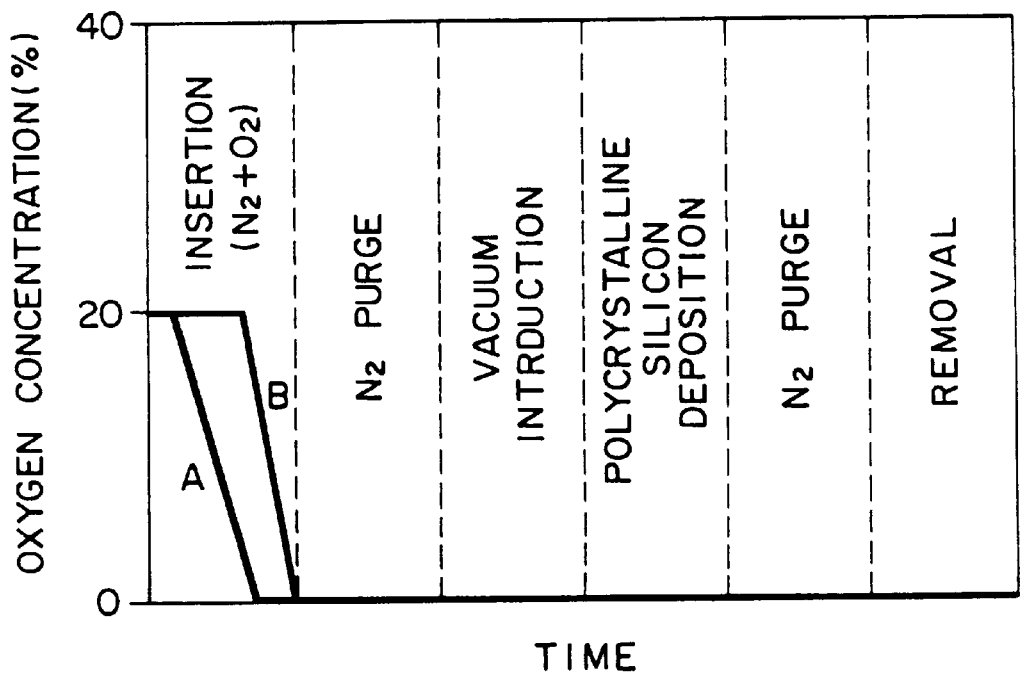
FIG. 5A and is a graph showing variation of an oxygen concentration within a conventional furnace tube.
Figure 5B:
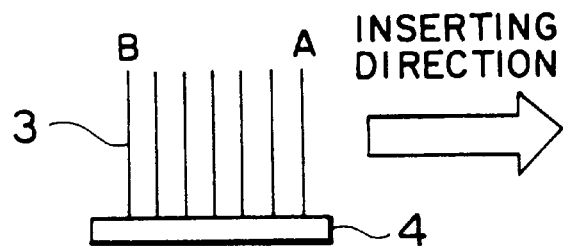
FIG. 5B is an illustration showing the positional relationship of semiconductor wafers in the conventional furnace tube.

FIGS. 5A and 5B are, respectively, a graph showing variation of oxygen concentration within the conventional furnace tube and an illustration showing a positional relationship of the semiconductor wafers within the furnace tube.

As shown in FIG. 5A, in the conventional process, the heat treatment process, insertion of the semiconductor wafers under flow of the $N_2$ gas, $N_2$ purge, introduction of vacuum, growth of polycrystalline silicon, $N_2$ purge and removal of the semiconductor wafers are performed. In the furnace tube 2, the oxygen concentration is lowered upon setting the semiconductor wafers in the furnace tube 2 since the $N_2$ gas is supplied in the furnace tube 2 upon insertion of the semiconductor wafers, as shown in FIG. 5A.

Then, the timing of lowering of the oxygen concentration is differentiated at the wafer A positioned at the leading end of the boat 4 and the wafer B positioned at rear position of the boat 4, as shown in FIG. 5B.

Thus, in the prior art, as shown in FIGS. 5A and 5B, the exposure periods for the wafer A at the leading side and the wafer B at the rear side to $O_2$ gas are differentiated. Therefore, it is inevitable that form the natural oxide layer will be formed with substantial fluctuation in thickness.

In contrast to this, according to the illustrated embodiment of the fabrication process according to the present invention, lowering of the oxygen concentration is caused simultaneously at all of the wafers, the influence of penetration of ambient air on formation of the natural oxide layer can be successfully avoided. Namely, as shown in FIG. 4, the difference of variation of the oxygen concentration over time at each wafer, between the wafers and between batch processes can be eliminated. Therefore, a uniform natural oxide layer with little fluctuation in thickness can be formed in the emitter contact portion to improve controllability of $h_{FE}$.

As set forth above, according to the present invention, penetration of the ambient air, namely penetration of the ambient air in the clean room upon setting of the semiconductor wafers in the furnace, can be successfully avoided. Also, a natural oxide layer can be formed during formation of the polycrystalline silicon layer. Accordingly, by applying the shown embodiment the fabrication process for a bipolar transistor, the thickness of the natural oxide layer to be formed in the emitter contact portion can be made uniform. By this, fluctuation of $h_{FE}$ in each wafer, between the wafers and between batch processes can be eliminated to improve controllability of $h_{FE}$.

In particular, while the fluctuation (maximum value/minimum value) of $h_{FE}$ in the conventional fabrication process is 2 to 3, the present invention can reduce the fluctuation of $h_{FE}$ to 1.5 to 2.

Furthermore, as shown in FIG. 3, since only an $O_2$ introduction port is additionally required in the heat treatment apparatus, the present invention will not cause a substantial increase of the process cost in comparison with the conventional apparatus. Also, as can be clear from comparison between FIGS. 4 and 5A, the process period may not be longer than the conventional process. With the present invention, for reduction of fluctuation of $h_{FE}$, 10% of improvement in the yield can be achieved.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments within a scope encompassed and equivalents thereof with respect to the features set out in the appended claims.

For instance, while the present invention has been discussed in terms of the preferred embodiment directed to the construction of the heat treatment furnace with the heat treatment apparatus illustrated in FIG. 3 as an example, the present invention should not be limited to the shown construction. The present invention is also applicable for apparatus to be employed in the semiconductor devices, in which the semiconductor wafer is introduced from an ambient pressure condition at a room temperature into a reaction facility at higher temperature than the room temperature, such as a lamp annealer and so forth.

What is claimed is:

1. A method for fabricating a semiconductor device in a heat treatment chamber defining an inner space, said method comprising the steps of:

maintaining said inner space of said heat treatment chamber under a mixture gas containing $O_2$ and an inert gas, a concentration of $O_2$ in said mixture gas being between 15 and 25 volume percent;

inserting at least one semiconductor wafer on which a natural oxide layer is disposed from said ambient air outside said heat treatment chamber into said heat treatment chamber under said mixture gas; and performing heat treatment for the semiconductor wafer within said heat treatment chamber with the natural oxide layer being retained on the semiconductor wafer.

2. The method of claim 1, wherein said heat treatment comprises low pressure chemical vapor deposition of a polycrystalline silicon layer.

3. The method of claim 2, wherein said polycrystalline layer forms an emitter electrode of a bipolar transistor.

4. The method of claim 1, further comprising:
purging said heat treatment chamber with an inert gas between said step of inserting said semiconductor wafer within said heat treatment chamber and said step of performing heat treatment.

5. The method of claim 1, further comprising:
purging said heat treatment chamber with an inert gas after said step of performing heat treatment.

6. The method of claim 1, wherein said heat treatment chamber is a furnace tube.

7. The method of claim 1, wherein said mixture gas contains 78 to 82 vol % of said inert gas and 18 to 22 vol % of $O_2$.

8. The method of claim 1, wherein said inert gas is $N_2$.

9. The method of claim 4, wherein said inert gas is $N_2$.

10. The method of claim 5, wherein said inert gas is $N_2$.

11. The method of claim 1, wherein said inert gas is $N_2$.

12. The method of claim 7, wherein said inert gas is $N_2$.

13. A method for inserting a semiconductor wafer into a chamber defining an inner space so as to obtain a substantially uniform natural oxide layer on at least a portion of said semiconductor wafer, said method comprising the steps of:

maintaining said inner space of said chamber under a mixture gas containing $O_2$ and an inert gas, a concentration of $O_2$ in said mixture gas being between 15 and 25 volume percent; and inserting said semiconductor wafer from said ambient air outside said heat treatment chamber into said chamber under said mixture gas, the concentration of $O_2$ in the mixture gas remaining constant during the inserting step.

14. The method of claim 13, wherein said chamber is a heat treatment chamber.

15. The method of claim 13, wherein said inert gas is $N_2$.

16. The method of claim 1, wherein said mixture gas contains approximately 20 vol % of $O_2$.

17. The method of claim 13, wherein said mixture gas contains 18–22 vol % of $O_2$.

18. The method of claim 13, wherein said mixture gas contains approximately 20 vol % of $O_2$.

* * * * *